(12) United States Patent
Kohara et al.

(10) Patent No.: US 8,093,699 B2
(45) Date of Patent: Jan. 10, 2012

(54) CIRCUIT DEVICE WITH CIRCUIT BOARD AND SEMICONDUCTOR CHIP MOUNTED THEREON

(75) Inventors: Yasuhiro Kohara, Gifu (JP); Ryosuke Usui, Ichinomiya (JP); Hideki Mizuhara, Ichinomiya (JP); Yasunori Inoue, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 221 days.

(21) Appl. No.: 11/313,743

(22) Filed: Dec. 22, 2005

(65) Prior Publication Data

US 2006/0131746 A1 Jun. 22, 2006

(30) Foreign Application Priority Data

Dec. 22, 2004 (JP) ................. 2004-370774

(51) Int. Cl.
*H01L 23/48* (2006.01)

(52) U.S. Cl. ......... 257/684; 257/E23.069; 257/E23.119; 257/E23.092; 257/E23.114; 257/788; 257/737; 257/796; 257/738; 257/778; 257/789; 257/795; 257/790

(58) Field of Classification Search ........... 257/E23.092, 257/E23.114, E21.503, 788, 789, 780, 795, 257/787, 737, 738, 778, 684, 796, E23.069, 257/E23.119, 790
See application file for complete search history.

(56) References Cited

U.S. PATENT DOCUMENTS

| | | | | |
|---|---|---|---|---|
| 5,677,575 A | * | 10/1997 | Maeta et al. | 257/778 |
| 5,870,289 A | * | 2/1999 | Tokuda et al. | 361/779 |
| 5,925,930 A | * | 7/1999 | Farnworth et al. | 257/737 |
| 5,990,546 A | * | 11/1999 | Igarashi et al. | 257/700 |
| 6,300,686 B1 | * | 10/2001 | Hirano et al. | 257/783 |
| 6,350,664 B1 | * | 2/2002 | Haji et al. | 438/459 |
| 6,448,635 B1 | * | 9/2002 | Glenn | 257/676 |
| 6,448,665 B1 | * | 9/2002 | Nakazawa et al. | 257/789 |
| 6,486,006 B2 | * | 11/2002 | Hirano et al. | 438/125 |
| 6,683,379 B2 | * | 1/2004 | Haji et al. | 257/729 |
| 6,885,099 B2 | * | 4/2005 | Ogawa | 257/701 |
| 6,951,811 B2 | * | 10/2005 | Sorimachi | 438/637 |

(Continued)

FOREIGN PATENT DOCUMENTS

JP 09-246318 9/1997

(Continued)

OTHER PUBLICATIONS

Japanese Notification of Reason(s) for Refusal, w/ English translation thereof, issued in Japanese Patent Application No. JP 2004-370774 dated May 11, 2010.

(Continued)

*Primary Examiner* — Alexander O Williams
(74) *Attorney, Agent, or Firm* — McDermott Will & Emery LLP

(57) ABSTRACT

A circuit device in which highly reliable sealing with a resin can be achieved is provided. A semiconductor chip is provided on one surface of an insulating resin film and a conductive layer that is electrically connected to the semiconductor chip is provided on another surface of the insulating resin film. A solder ball (electrode) for the connection to a circuit board is provided on the conductive layer. An insulating resin layer is further provided between the conductive layer and the circuit board to embed the electrode therein. In this manner, the circuit device is formed. A side face of the semiconductor chip is covered with the insulating resin film.

7 Claims, 6 Drawing Sheets

U.S. PATENT DOCUMENTS

| | | |
|---|---|---|
| 6,955,944 B2 | 10/2005 | Horie |
| 6,964,887 B2 * | 11/2005 | Akagawa ................. 438/126 |
| 7,022,552 B2 | 4/2006 | Yamaguchi |
| 7,091,599 B2 * | 8/2006 | Fujimori ................. 257/692 |
| 2002/0061642 A1 * | 5/2002 | Haji et al. ............... 438/613 |
| 2003/0122243 A1 * | 7/2003 | Lee et al. ............... 257/700 |
| 2003/0209806 A1 * | 11/2003 | Akagawa ................. 257/758 |
| 2004/0150081 A1 * | 8/2004 | Ogawa ................... 257/678 |
| 2004/0154163 A1 * | 8/2004 | Miyazaki et al. ............. 29/832 |
| 2004/0229446 A1 * | 11/2004 | Sorimachi ............... 438/463 |
| 2004/0256734 A1 * | 12/2004 | Farnworth et al. .......... 257/777 |
| 2005/0048759 A1 * | 3/2005 | Hsu .................... 438/618 |
| 2005/0112798 A1 * | 5/2005 | Bjorbell ................ 438/106 |
| 2006/0073638 A1 * | 4/2006 | Hsu .................... 438/110 |
| 2006/0103028 A1 * | 5/2006 | Hazeyama et al. .......... 257/778 |
| 2006/0145328 A1 * | 7/2006 | Hsu .................... 257/690 |
| 2006/0163722 A1 * | 7/2006 | Hsu .................... 257/737 |
| 2006/0220230 A1 * | 10/2006 | Tanaka et al. .............. 257/723 |
| 2007/0020912 A1 * | 1/2007 | Nishiyama et al. ........... 438/613 |
| 2007/0057358 A1 * | 3/2007 | Satou et al. .............. 257/686 |
| 2007/0111398 A1 * | 5/2007 | Hsu .................... 438/125 |
| 2007/0126085 A1 * | 6/2007 | Kawano et al. ............. 257/621 |
| 2007/0128881 A1 * | 6/2007 | Cowens et al. ............. 438/758 |
| 2007/0132063 A1 * | 6/2007 | Min et al. ................ 257/532 |
| 2008/0007927 A1 * | 1/2008 | Ito et al. ................ 361/764 |
| 2008/0023819 A1 * | 1/2008 | Chia et al. ............... 257/692 |
| 2008/0265434 A1 * | 10/2008 | Kurita ................... 257/777 |
| 2009/0011542 A1 * | 1/2009 | Lee et al. ............... 438/113 |

FOREIGN PATENT DOCUMENTS

| | | | | |
|---|---|---|---|---|
| JP | 2000-243729 A | | | 9/2000 |
| JP | 2000-243729 A | * | | 9/2000 |
| JP | 2001-156172 | | | 6/2001 |
| JP | 2001-203229 | | | 7/2001 |
| JP | 2002-093945 | | | 3/2002 |
| JP | 2002-222901 | | | 8/2002 |
| JP | 2002-290036 | | | 10/2002 |
| JP | 2002-313696 | | | 10/2002 |
| JP | 2003-017530 | | | 1/2003 |
| JP | 2004-079716 | | | 3/2004 |
| JP | 2004-79716 A | * | | 3/2004 |
| JP | 2004-343123 | | | 12/2004 |
| JP | 2004-343123 A | * | | 12/2004 |
| JP | 2005-101367 A | * | | 4/2005 |
| JP | 2005-216999 A | * | | 8/2005 |
| JP | 2007-258776 A | * | | 10/2007 |

OTHER PUBLICATIONS

Japanese Office Action issued in Japanese Patent Application No. JP 2004-370774 dated Jun. 14, 2011.

* cited by examiner

70

CIRCUIT DEVICE WITH CIRCUIT BOARD AND SEMICONDUCTOR CHIP MOUNTED THEREON

BACKGROUND OF THE INVENTION

1. Field of the Invention

The present invention relates to a circuit device.

2. Description of the Related Art

In recent years, portable electronics equipment such as a cell-phone, PDA, DVC, and DSC has become sophisticated at a rapid pace. In order for products of such equipment to be accepted in the marketplace, reduction in size and weight of the product is necessary. To satisfy the demands, a highly integrated system LSI is required. Moreover, ease of use and convenience are also required for the above electronics equipment. Thus, an LSI used in the above electronics equipment has to be more sophisticated and have higher performance. Therefore, the number of inputs and outputs are increased with increase of an integration degree in an LSI chip, whereas reduction of a size of a package is strongly demanded. In order to achieve a good balance between the above demands, development of a semiconductor package suitable for high-density mounting of semiconductor parts onto a substrate is strongly required. Various types of a packaging technique called as CSP (Chip Size Package) have been developed in order to deal with the above request.

There are various types of CSP. An exemplary type is described in Japanese Patent Laid-Open Publication No. 2000-243729. FIG. 5 is a cross-sectional view showing an exemplary semiconductor device described in Japanese Patent Laid-Open Publication No. 2000-243729.

A number of solder balls 72 as terminals for external connection are two-dimensionally arranged on a mounting-face side (upper side in FIG. 5) of a packaged semiconductor device 70. Each solder ball 72 is electrically connected to a corresponding electrode pad 76 of a semiconductor chip 71 through a Cu bump 74 and a Cu wiring 75 that are covered with a package resin 73. A peripheral portion 77 of the semiconductor chip 71 on the mounting-face side is diagonally cut, and part of the package resin 73 also covers the peripheral portion 77. This wrap-around of the package resin 73 can improve reliability for sealing the semiconductor chip 71.

FIG. 6 is a cross-sectional view of a circuit device 70a in which the conventional semiconductor device 70 described above is mounted on a circuit board 78. The semiconductor device 70 is mounted on the circuit board (printed wiring board) 78 via the respective solder balls 72, thereby forming the circuit device 70a. A sealing resin 79 is provided between the semiconductor device 70 and the circuit board 78, so that the semiconductor device 70 is fixed on the circuit board 78. However, separation may occur at an interface between the package resin 73 and the semiconductor chip 71 because of a difference between a coefficient of linear expansion of the semiconductor chip 71 and that of the package resin 73 and the like, although the peripheral portion 77 of the semiconductor chip 71 on the mounting-face side in the circuit device 70a (semiconductor device 70) is diagonally cut so as to increase a contact area between the semiconductor chip 71 and the package resin 73 and improve joint strength therebetween. Especially, when a solder ball 72 having a large area is formed, stress load becomes large and it is going to be more likely that the separation occurs. Thus, it is necessary to provide the sealing resin 79 up to a sidewall of the semiconductor chip 71, so that the semiconductor chip 71 is fixed with the sealing resin 79.

SUMMARY OF THE INVENTION

It is therefore an object of the present invention to provide a circuit device in which highly reliable sealing with a resin can be achieved and a method for manufacturing that circuit device.

In order to achieve the objects, according to an aspect of the present invention, a circuit device includes: a first insulating resin layer; a semiconductor chip provided on one surface of the first insulating resin layer; a conductive layer provided on another surface of the first insulating resin layer; an electrode for connecting the conductive layer to a circuit board; and a second insulating resin layer provided between the conductive layer and the circuit board to embed the electrode therein, wherein a side face of the semiconductor chip is covered with the first insulating resin layer.

According to this configuration, the side face (peripheral portion) of the semiconductor chip is covered with the first insulating resin layer. Thus, the first insulating resin forces down the semiconductor chip from all around even when a shearing stress is caused by a difference between a coefficient of linear expansion of the semiconductor chip and that of the first insulating resin. Therefore, separation at an interface between the first insulating resin and the semiconductor chip does not occur and reliability of joint between the semiconductor chip and the first insulating resin layer is improved. Moreover, it is possible to eliminate the need for forming the second insulating resin layer up to a position of the side face (peripheral portion) of the semiconductor chip and fixing the semiconductor chip as in a conventional configuration, because the first insulating resin layer covers the side face (peripheral portion) of the semiconductor chip and the first insulating resin layer and the semiconductor chip are fixed by fixing the first insulating resin layer with the second insulating resin layer. Therefore, it is possible to reduce the used amount of the second insulating resin layer, thus enabling a circuit device having high joint reliability to be provided at a reduced cost.

It is desirable that the conductive layer be also provided on a portion of the first insulating resin layer outside the semiconductor chip in the above configuration. In this configuration, a connecting portion of the electrode can be arranged on the portion of the first insulating resin layer outside the semiconductor chip. Thus, stress load applied to the semiconductor chip when the electrode is formed can be reduced, and therefore reliability of the joint between the semiconductor chip and the first insulating resin layer can be further improved.

It is desirable that the one surface of the first insulating resin layer be a plasma-treated surface in the above configuration. In this configuration, adhesion between the first insulating resin layer and the semiconductor chip provided on the one surface of the first insulating resin layer can be further improved.

It is desirable that the first insulating resin layer contain a filler in the above configuration. In this configuration, rigidity of the first insulating resin layer can be improved and therefore the adhesion between the first insulating resin layer and the semiconductor chip can also be improved.

DETAILED DESCRIPTION OF THE INVENTION

Figure 1A:
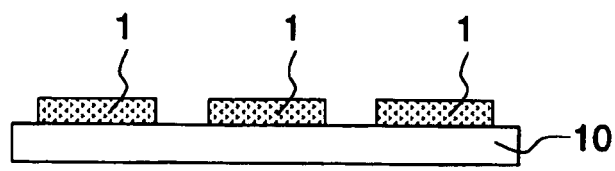
FIGS. 1A to 1D are cross-sectional views showing manufacturing steps of a circuit device according to a first embodiment of the present invention.

Embodiments of the present invention are now described, referring to the drawings. In the drawings, like parts or elements are denoted by like reference numerals and the description thereof is omitted in an appropriate manner. In the present specification, the term "up" means a notion determined by a forming order of films. That is, with respect to a film formed first, a direction in which a film formed later exists is defined as an upward direction.

Embodiment 1

FIGS. 1A to 1D, 2A to 2D, 3A and 3B are cross-sectional views showing a semiconductor integrated circuit device and manufacturing steps thereof according to a first embodiment of the present invention.

(Step 1: FIG. 1A) A plurality of semiconductor chips 1 are arranged in a matrix on a base material 10. An interval between the semiconductor chips 1 can be set to a given value in accordance with a layout of a wiring layer 3 formed later. The base material 10 may be a tape-like base material that is adherent and has a surface to which the semiconductor chip 1 can be fixed. Moreover, the base material 10 may be formed from a material that can be separated from an insulating resin film 2 after the semiconductor chip 1 is embedded in the insulating resin film 2. For example, a PET film can be used as such a material.

The semiconductor chip 1 is obtained by separating semiconductor devices formed in a matrix on a surface of a silicon wafer from each other into individual chips. A plurality of electrode pads (not shown) extended from the semiconductor device are exposed on a surface of the semiconductor chip 1. In a later step, each electrode pad is electrically connected to a terminal for external connection.

Figure 1B:
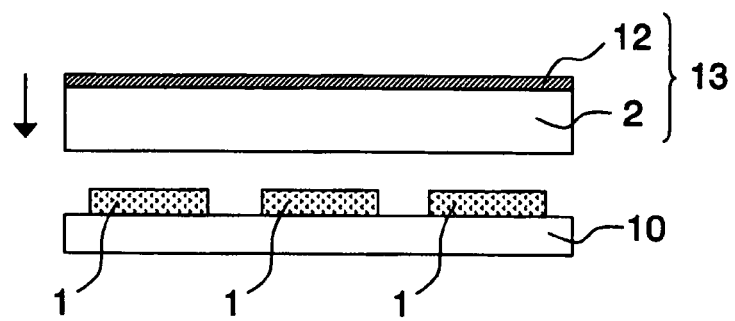

(Step 2: FIG. 1B) While the semiconductor chip 1 is fixed, an insulating resin film with a conductive film 13 is arranged on the base material 10. The insulating resin film 13 is formed by the insulating resin film 2 and a conductive film 12. Then, the insulating resin film with the conductive film 13 is pressed against the base material 10, thereby pressing the semiconductor chip 1 into the insulating resin film 2.

Figure 1C:
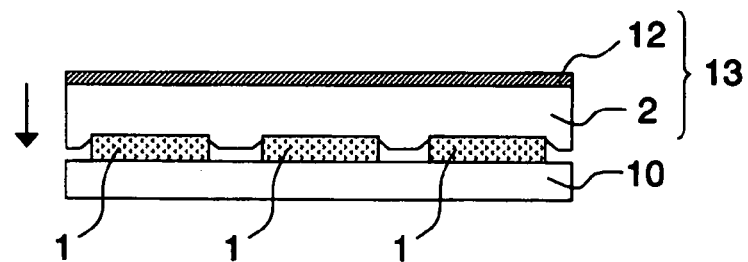
Figure 1D:
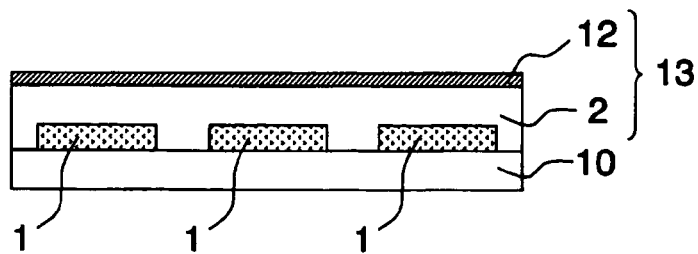

(Step 3: FIGS. 1C and 1D) The insulating resin film 2 is heated under vacuum or reduced pressure so as to be pressure-bonded to the base material 10. Thus, the semiconductor chip 1 is embedded in the insulating resin film 2 and is pressure-bonded to the insulating resin film 2, as shown in FIG. 1D.

The conductive film 12 is formed from a rolled metal such as rolled copper foil. As the insulating resin film 2, any material can be used, as long as it can be softened when being heated. Examples of the material for the insulating resin film 2 include epoxy resins, melamine derivatives such as BT resins, liquid crystal polymers, PPE resins, polyimide resins, fluorine resins, phenol resins, and polyamidebismaleimide.

The use of those materials can improve rigidity and stability of the semiconductor device. When epoxy resins or thermosetting resins such as BT resins, PPE resins, polyimide resins, fluorine resins, phenol resins, and polyamidebismaleimide is used for the insulating resin film 2, the rigidity of the semiconductor integrated circuit device can be further improved.

Examples of the epoxy resins include bisphenol A type resins, bisphenol F type resins, bisphenol S type resins, phenol novolac resins, cresol novolac type epoxy resins, trisphenol methane type epoxy resins, and alicyclic epoxy resins.

Examples of the melamine derivatives include melamine derivatives and guanidine compounds such as melamine, melamine cyanurate, methylol melamine, (iso)cyanuric acid, melam, melem, melon, succinoguanamine, melamine sulfate, acetoguanamine sulfate, melam sulfate, guanylmelamine sulfate, melamine resin, BT resin, cyanuric acid, isocyaneric acid, isocyanuric acid derivatives, melamine isocyanurate, benzoguanamin, and acetoguanamine.

Examples of the liquid crystal polymers include aromatic liquid crystal polyesters, polyimides, polyester amides, and resin compositions containing any of those materials. It is preferable to use a liquid crystal polyester with well-balanced heat resistance, processability, and a hygroscopic property, or a composition containing the same.

Examples of the liquid crystal polyesters include (1) a liquid crystal polyester obtained by reaction of an aromatic dicarboxylic acid, an aromatic diol, and an aromatic hydroxycarboxylic acid, (2) a liquid crystal polyester obtained by reaction of aromatic hydroxycarboxylic acids that are different from each other, (3) a liquid crystal polyester obtained by reaction of an aromatic dicarboxylic acid and an aromatic diol, and (4) a liquid crystal polyester obtained by reaction of a polyester such as polyethylene terephthalate and an aromatic hydroxycarboxylic acid. Alternatively, the aromatic dicarboxylic acid, the aromatic diol, and the aromatic hydroxycarboxylic acid that are described above may be replaced with ester derivatives thereof. Moreover, the aromatic dicarboxylic acid, the aromatic diol, and the aromatic hydroxycarboxylic acid may be replaced with materials obtained by substituting a halogen atom, an alkyl group, an aryl group, or the like for a hydrogen atom of an aromatic portion thereof.

Examples of a repeated structural unit in the liquid crystal polyester include a repeated structural unit derived from an aromatic dicarboxylic acid (Chemical formula (i)), a repeated structural unit derived from an aromatic diol (Chemical formula (ii)), and a repeated structural unit derived from an aromatic hydroxycarboxylic acid (Chemical formula (iii)).

$$—CO-A1-CO— \qquad (i)$$

(A1 is a divalent linking group containing an aromatic ring.)

$$—O-A2-O— \qquad (ii)$$

(A2 is a divalent linking group containing an aromatic ring.)

$$—CO-A3-O— \qquad (iii)$$

(A3 is a divalent linking group containing an aromatic ring.)

The insulating resin film 2 may contain a filler or a filling material such as fibers. As the filler, $SiO_2$, SiN, AlN, and $Al_2O_3$ in the form of powder or fibers can be used, for example. By allowing the insulating resin film 2 to contain the filler or fibers, it is possible to reduce warpage of the insulating resin film 2 during cooling of the insulating resin film 2 to, for example, a room temperature after the insulating resin film 2 is heated to perform thermocompression bonding of the semiconductor chip 1. Thus, the adhesion between the semiconductor chip 1 and the insulating resin film 2 can be enhanced. Moreover, when the insulating resin film 2 contains fibers, the rigidity of the insulating resin film 2 can also be enhanced. This can enhance the adhesion between the insulating resin film 2 and the semiconductor chip 1. From those viewpoints, aramid nonwoven fabric is preferably used for forming the insulating resin film 2. In this case, processability can be improved.

Examples of the aramid fibers include para-aramid fibers and meta-aramid fibers. For example, poly(p-phenylene terephthalamide) (PPD-T) can be used as the para-aramid fibers, and poly(m-phenylene isophthalamide) (MPD-I) can be used as the meta-aramid fibers.

The content of the filling material in the material forming the insulating resin film 2 can be appropriately set in accordance with the material. For example, that content can be set to 50 wt % or less. In this case, the adhesion between the insulating resin film 2 and the semiconductor chip 1 can be kept favorable.

As the insulating resin film with the conductive film 13, the insulating resin film 2 in the form of a film with the conductive film 12 adhering thereto can be used. Moreover, the insulating resin film with the conductive film 13 can be formed by applying a resin composition forming the insulating resin film 2 on the conductive film 12 and then drying the applied resin composition. In the first embodiment of the present invention, the resin composition can contain a curing agent, a curing accelerator, and another component without departing from the object of the present invention. The insulating resin film with the conductive film 13 is arranged on the base material 10 while the insulating resin film 2 is put into B stage. In this manner, the adhesion between the insulating resin film 2 and the semiconductor chip 1 can be enhanced. Then, the insulating resin film 2 is heated in a manner in accordance with the type of the resin forming the insulating resin film 2, and the insulating resin film with the conductive film 13 and the semiconductor chip 1 are pressure-bonded to each other under vacuum or reduced pressure. In an alternative example, the insulating resin film with the conductive film 13 can be formed by arranging the insulating resin film 2 in the form of a film that is in B stage on the base material 10, arranging the conductive film 12 on the insulating resin film 2, and bonding the conductive film 12 to the insulating resin film 2 by thermocompression bonding during thermocompression bonding of the insulating resin film 2 to the semiconductor chip 1.

Moreover, in the present embodiment, a lower surface of the insulating resin film with the conductive film 13 formed by the conductive film 12 and the insulating resin film 2 may be plasma-treated.

The condition for plasma exposure is appropriately set in accordance with the used resin material so as to obtain surface characteristics to provide excellent interface adhesion. For example, the condition in which a plasma gas contains an inert gas such as argon is set in order to improve removal efficiency of organic matter adhering to a lower surface of the insulating resin film 2. In this case, the removal efficiency of the organic matter adhering to the lower surface of the insulating resin film 2 can be improved. Moreover, argon may be replaced with other inert gases such as nitrogen gas or rare gases.

An exemplary condition for plasma exposure is as follows.
Plasma gas: Argon 10 to 20 sccm, Oxygen 0 sccm
Bias (W): 100
RF power (W): 500
Pressure (Pa): 20
Process time (sec): 20

The adhesion between the semiconductor chip 1 and a portion of the insulating resin film 2 that is in contact with the chip 1 can be improved by plasma-treating the lower surface of the insulating resin film 2. Therefore, reliability of the joint between the semiconductor chip 1 and the insulating resin film 2 can be further improved.

Figure 2A:
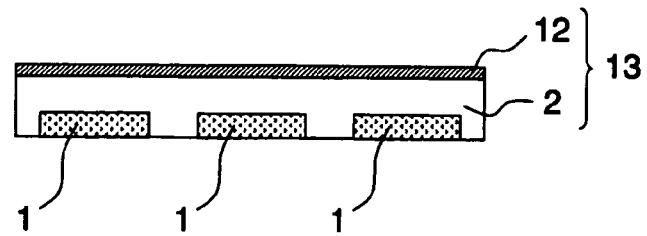
FIGS. 2A to 2D are cross-sectional views showing manufacturing steps of the circuit device according to the first embodiment of the present invention.

(Step 4: FIG. 2A) The insulating resin film with the conductive film 13 is bonded to the semiconductor chip 1 by thermocompression bonding so as to embed the semiconductor chip 1 in the insulating resin film 2. Then, the base material 10 is separated from the insulating resin film 2.

Exemplary separation methods include a method in which the base material 10 is gradually ground and removed using a grinding plate containing diamond to remove the base material 10, and a method in which a photoreactive adhesive having an adherent property that can be lowered by exposure of UV light is provided between the base material 10 and the semiconductor chip 1 and the base material 10 is separated by irradiating the photoreactive adhesive with UV light.

Since the semiconductor chip 1 is exposed in the above manner, it is possible to allow a heat to escape from the exposed surface even when a temperature of the semiconductor chip 1 increases during an operation of the semiconductor chip 1. Thus, a semiconductor device having a good heat-dissipation property can be provided.

Figure 2B:
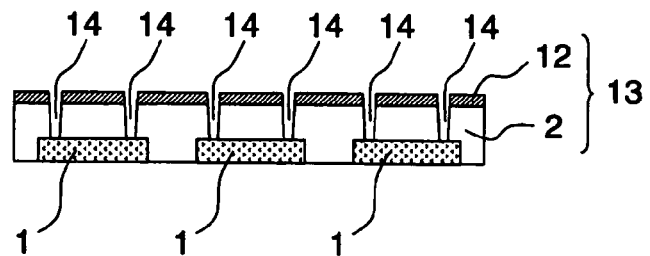

(Step 5: FIG. 2B) A wiring patterning step is performed for the conductive film 12 so as to form a wiring by laser drawing (trepanning alignment) or wet etching of Cu. Then, a via hole formation step is performed to form via holes (through holes) 14 in the insulating resin film 2 by combining a carbon dioxide laser, a YAG laser and dry etching.

Figure 2C:
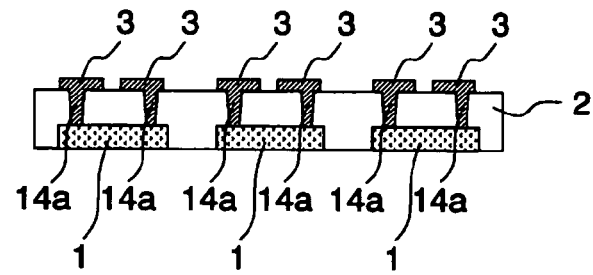

(Step 6: FIG. 2C) A plating step is performed using electroless and electrolytic Cu-plating that correspond to a high aspect ratio so as to form a conductive layer 3 and form a via 14a by filling the through hole 14 with a conductive material. Then, the conductive layer 3 is patterned by semi-additive plating to form a high-density wiring, thereby electrically connecting the conductive layer 3 and the semiconductor chip 1.

Figure 2D:
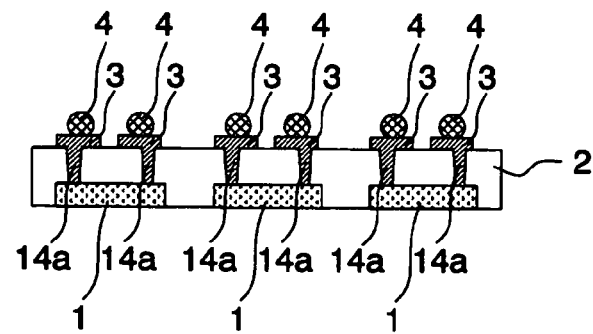

(Step 7: FIG. 2D) A solder ball (electrode) 4 serving as a terminal for external connection is formed on the conductive film 3 by solder printing.

More specifically, "solder paste" formed from a resin and a solder material in the form of paste is printed on a desired portion by using screen mask, and is then heated to a solder melting temperature. In this manner, the solder ball 4 is formed. Alternatively, flux may be applied on the conductive layer 3 in advance and thereafter the solder ball 4 may be mounted on the conductive layer 3.

Figure 3A:
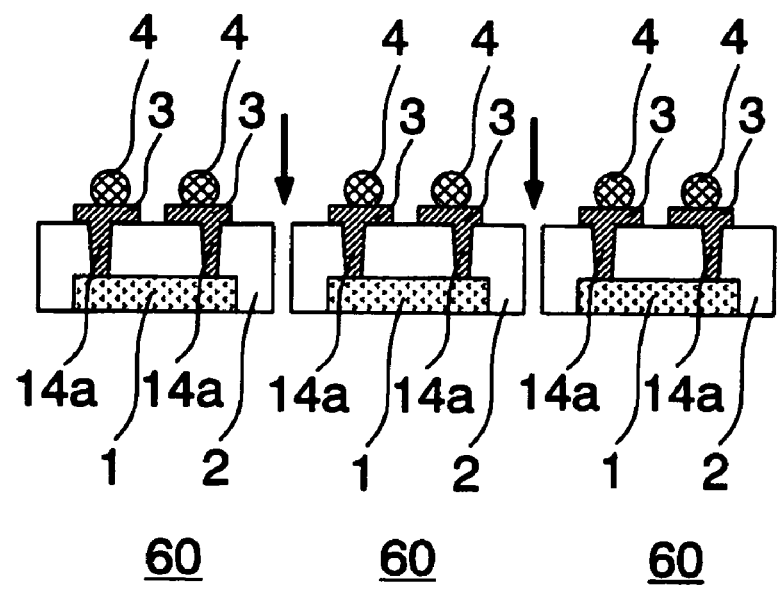
FIGS. 3A and 3B are cross-sectional views showing manufacturing steps of the circuit device according to the first embodiment of the present invention.

(Step 8: FIG. 3A) The insulating resin film 2 is diced along boundary lines between the semiconductor chips 1 so as to obtain a plurality of semiconductor chips 1 that are separated and embedded in the insulating resin film 2. In this manner, a structure 60 is formed.

Figure 3B:
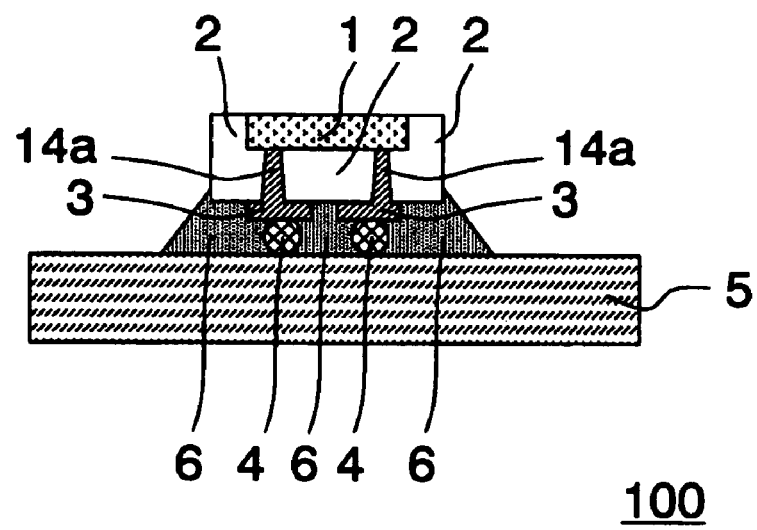

(Step 9: FIG. 3B) Finally, the structure 60 is turned upside down and is mounted on a circuit board (printed wiring board) 5 in such a manner that the solder ball 4 is electrically connected to the circuit board 5. In this state, the structure 60 is fixed to the circuit board 5 with an insulating resin layer 6.

The insulating resin layer 6 is formed by spraying a thermosetting resin mainly containing an epoxy resin or the like from a tip of a nozzle and then heating the thermosetting resin to a setting temperature.

The insulating resin film 2 covers a side face (peripheral portion) of the semiconductor chip 1. Furthermore, the insulating resin film 2 and the semiconductor chip 1 are fixed by fixing the insulating resin film 2 with the insulating resin layer 6. Thus, it is possible to eliminate the need for forming the insulating resin layer 6 to a position of the side face (peripheral portion) of the semiconductor chip 1 and fixing the semiconductor chip 1 as in the conventional configuration. Therefore, the structure 60 can be fixed only by covering a portion of the sidewall of the insulating resin film 2 that is close to a bottom of the insulating resin film 2. This can reduce the used amount of the material for the insulating resin layer 6.

As described above, according to the manufacturing method of the first embodiment, the side face of the semiconductor chip 1 can be covered with the insulating resin film 2 simultaneously with formation of the insulating resin film 2 serving as an insulating layer between the conductive layer 3 and the semiconductor chip 1. Thus, the circuit device 100 that has high joint reliability at the interface between the first insulating resin and the semiconductor chip can be manufactured without adding a new manufacturing step.

Embodiment 2

Figure 4:
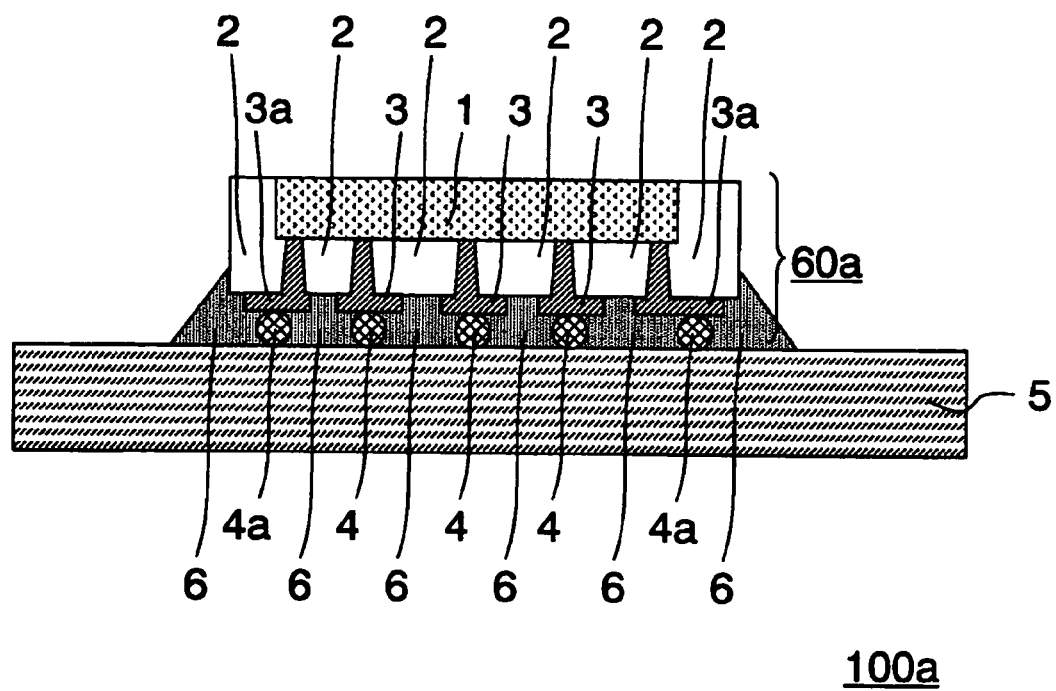
FIG. 4 is a cross-sectional view of a circuit device according to a second embodiment of the present invention.
Figure 5:
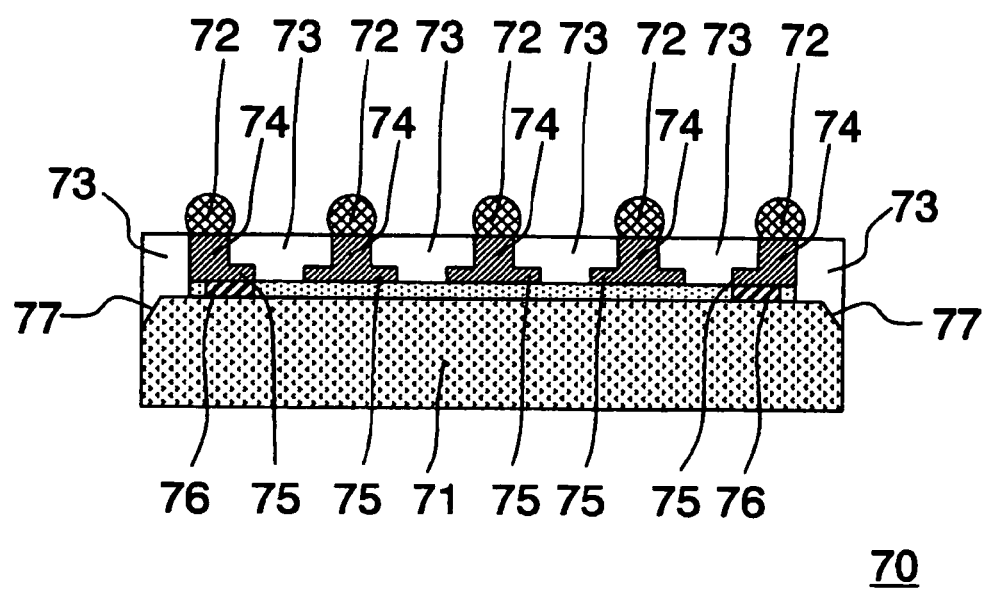
FIG. 5 is a cross-sectional view of a conventional semiconductor device.
Figure 6:
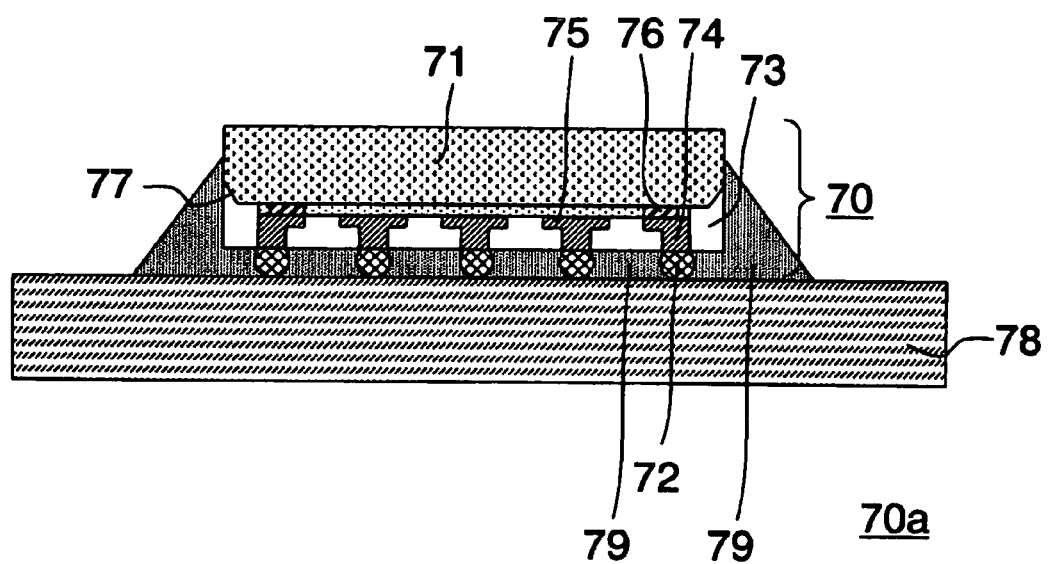
FIG. 6 is a cross-sectional view of a circuit device in which the conventional semiconductor device is mounted.

FIG. 4 is a cross-sectional view of a semiconductor integrated circuit device according to a second embodiment of the present invention. The second embodiment is different from the first embodiment in that the conductive layer 3 is also formed on a portion of the insulating resin film 2 outside the semiconductor chip 1.

When the conductive layer 3a is provided on the portion of the insulating resin film 2 outside the semiconductor chip 1, it is possible to arrange an electrode 4a above that portion. Thus, stress load applied to the semiconductor chip 1 during formation of the electrode 4a can be reduced and therefore reliability of the joint between the semiconductor chip 1 and the insulating resin film 2 can be further improved.

In order to manufacture a circuit device of the second embodiment of the present invention, the interval between the semiconductor chips is adjusted in Step 1 of the first embodiment, and a wiring layer 3a is also formed on the portion of the insulating resin film 2 outside the semiconductor chip 1 in Step 6.

A structure 60a (the insulating resin film 2 including the semiconductor chip 1) can be formed to have a size having a desired area only by adjusting the interval between the semiconductor chips in Step 1 of the first embodiment. In particular, as the portion of the insulating resin film 2 outside the semiconductor chip 1 becomes wider, freedom of designing the conductive layer 3 formed on the insulating resin film 2 can be increased. Therefore, a manufacturing cost of the circuit device 100a can be easily reduced.

The present invention is not limited to the aforementioned embodiments. Alternatively, the wiring layer connected to the solder ball (electrode) may have a multilayer structure. In case of a double layer structure, for example, a further insulating resin film and a conductive film formed thereon are formed on the components of the semiconductor device after Step 6 of the first embodiment is performed. Then, for the further insulating resin film and the conductive film formed thereon, the wiring patterning step, the via hole formation step, the plating step, and the wiring formation step are performed in the same manner as that in the first embodiment, thereby forming a double-layer wiring. Then, Step 7 and the following steps of the first embodiment are performed. In this manner, a circuit device is formed. In this case, the freedom of designing the wiring layer can be further increased.

Moreover, various modifications can be made to the present invention based on knowledge of a skilled person in the art. It should be noted that embodiments obtained by making those modifications to the present invention can fall within the scope of the present invention.

What is claimed is:

1. A circuit device comprising:
   a first insulating resin layer;
   a semiconductor chip provided on a first surface of the first insulating resin layer;
   a conductive layer provided on an opposite second surface of the first insulating resin layer;
   an electrode for connecting the conductive layer to a circuit board; and
   a second insulating resin layer provided between the conductive layer and the circuit board to embed the electrode therein and filling a space between the conductive layer and the circuit board,
   wherein the second insulating resin layer continuously covers bottom and side surfaces of the first insulating resin layer outside outer edges of the semiconductor chip, and
   wherein a side face of the semiconductor chip is covered with the first insulating resin layer and the conductive layer is provided to extend outside the outer edges of the semiconductor chip.

2. The circuit device according to claim 1, wherein the conductive layer is also provided in via holes formed inside the first insulating resin layer outside the semiconductor chip.

3. The circuit device according to claim 1, wherein the conductive layer has a multilayer structure.

4. The circuit device according to claim 1, wherein the one surface of the first insulating resin layer is a plasma-treated surface.

5. The circuit device according to claim 1, wherein the first insulating resin layer contains a filler.

6. The circuit device according to claim 1, wherein the top surface of the first insulating resin layer is flush with the top surface of the semiconductor chip.

7. The circuit device according to claim 1, wherein the electrode is provided on the conductive layer.

* * * * *